United States Patent
Satou

(10) Patent No.: US 12,444,534 B2
(45) Date of Patent: Oct. 14, 2025

(54) MOUNTING STRUCTURE AND MOUNTING METHOD OF ELECTRONIC COMPONENT

(71) Applicant: Murata Manufacturing Co., Ltd., Nagaokakyo (JP)

(72) Inventor: Daichi Satou, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 226 days.

(21) Appl. No.: 18/121,635

(22) Filed: Mar. 15, 2023

(65) Prior Publication Data

US 2023/0298814 A1  Sep. 21, 2023

(30) Foreign Application Priority Data

Mar. 18, 2022 (JP) ................. 2022-044344

(51) Int. Cl.
| | |
|---|---|
| H01G 2/06 | (2006.01) |
| H01G 4/12 | (2006.01) |
| H01G 4/248 | (2006.01) |
| H01G 4/30 | (2006.01) |
| H05K 1/11 | (2006.01) |
| H05K 1/18 | (2006.01) |

(52) U.S. Cl.
CPC ........... *H01G 2/065* (2013.01); *H01G 4/1227* (2013.01); *H01G 4/248* (2013.01); *H01G 4/30* (2013.01); *H05K 1/111* (2013.01); *H05K 1/181* (2013.01); *H05K 2201/10015* (2013.01); *H05K 2201/10636* (2013.01)

(58) Field of Classification Search
CPC ...... H01G 2/065; H01G 4/1227; H01G 4/248; H01G 4/30; H05K 1/111; H05K 1/181; H05K 2201/10015; H05K 2201/10636
See application file for complete search history.

(56) References Cited

U.S. PATENT DOCUMENTS

| | | | | |
|---|---|---|---|---|
| 2003/0184986 A1* | 10/2003 | Soga | ...................... | H05K 3/3452 361/767 |
| 2009/0073664 A1* | 3/2009 | Winger | .................... | H01L 23/50 361/734 |
| 2012/0200366 A1* | 8/2012 | Nishiyama | ............... | H03H 9/13 331/158 |
| 2014/0198427 A1* | 7/2014 | Kamobe | .............. | H01G 4/2325 361/301.4 |

(Continued)

FOREIGN PATENT DOCUMENTS

| | | |
|---|---|---|
| JP | 2006202859 A | 8/2006 |
| JP | 2012033621 A | 2/2012 |

(Continued)

*Primary Examiner* — Michael P Mcfadden

(74) *Attorney, Agent, or Firm* — Keating & Bennett, LLP

(57) ABSTRACT

A mounting structure of an electronic component includes at least two electrode pads spaced apart from each other on a board, at least two external electrodes of the electronic component respectively connected to the at least two electrode pads, and a resist film located around each of the at least two electrode pads on a surface of the board. A predetermined separation distance in a surface direction of the board is set between the resist film and each of the at least two external electrodes provided respectively on the at least two electrode pads. At least a surface layer of each of the at least two external electrodes includes about 99 wt % or more of Sn.

18 Claims, 7 Drawing Sheets

(56) References Cited

U.S. PATENT DOCUMENTS

| | | | | |
|---|---|---|---|---|
| 2015/0062775 A1* | 3/2015 | Shibasaki | ............. | H01G 4/012 |
| | | | | 361/301.4 |
| 2015/0223334 A1* | 8/2015 | Nakagawa | ............... | H01G 4/12 |
| | | | | 174/258 |
| 2016/0007446 A1* | 1/2016 | Ishikawa | .................. | H01G 4/12 |
| | | | | 361/301.4 |
| 2016/0381802 A1* | 12/2016 | Taniguchi | ............. | H01G 4/008 |
| | | | | 174/260 |
| 2017/0164472 A1* | 6/2017 | Matsuura | ............. | H05K 3/0023 |
| 2022/0353995 A1* | 11/2022 | Tsuboi | ................... | H05K 1/111 |

FOREIGN PATENT DOCUMENTS

| | | | |
|---|---|---|---|
| JP | 2013004656 A | | 1/2013 |
| JP | 2013-105969 A | | 5/2013 |
| JP | 2017103367 A | | 6/2017 |

* cited by examiner

MOUNTING STRUCTURE AND MOUNTING METHOD OF ELECTRONIC COMPONENT

CROSS REFERENCE TO RELATED APPLICATIONS

This application claims the benefit of priority to Japanese Patent Application No. 2022-044344 filed on Mar. 18, 2022. The entire contents of this application are hereby incorporated herein by reference.

BACKGROUND OF THE INVENTION

1. Field of the Invention

The present invention relates to a mounting structure and a mounting method of an electronic component.

2. Description of the Related Art

Conventionally, a mounting structure has been known in which external electrodes of a two-terminal electronic component such as a multilayer ceramic capacitor or an inductor are connected to a board having a circuit by metal bonding such as soldering to a pair of electrode pads provided on the board (refer to Japanese Unexamined Patent Application Publication No. 2013-105969, etc.).

Usually, in this kind of mounting structure, a resist film for protecting the circuit is provided on the surface of the board, and the electrode pad is surrounded by the resist film. Although the electrode pad has a predetermined area corresponding to the external electrode and is exposed at the surface of the board, depending on the design of the resist film, a portion of the external electrode is placed on the resist film, such that the external electrode cannot be provided in an appropriate state with respect to the electrode pad, which may result in insufficient soldering.

SUMMARY OF THE INVENTION

Preferred embodiments of the present invention provide mounting structures and mounting methods of electronic components that each reliably bring an external electrode into contact with an electrode pad by making it difficult for the external electrode to interfere with a resist film, and thus obtain a good bonding state.

A preferred embodiment of the present invention provides a mounting structure of an electronic component including at least two electrode pads spaced apart from each other on a board, at least two external electrodes of the electronic component, the at least two external electrodes being respectively connected to the at least two electrode pads, and a resist film provided around each of the at least two electrode pads on a surface of the board, wherein a predetermined separation distance in a surface direction of the board is set between the resist film and each of the at least two external electrodes provided respectively on the at least two electrode pads, and at least a surface layer of each of the at least two external electrodes includes about 99 wt % or more of Sn.

According to preferred embodiments of the present invention, it is possible to provide mounting structures and mounting methods of electronic components that each reliably bring an external electrode into contact with an electrode pad by making it difficult for the external electrode to interfere with a resist film and obtain a good bonding state.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings. The preferred embodiments relate to structures and methods of mounting a multilayer ceramic capacitor 10 shown in FIGS. 1 and 2 on a board. First, the multilayer ceramic capacitor 10 will be described.

Figure 1:
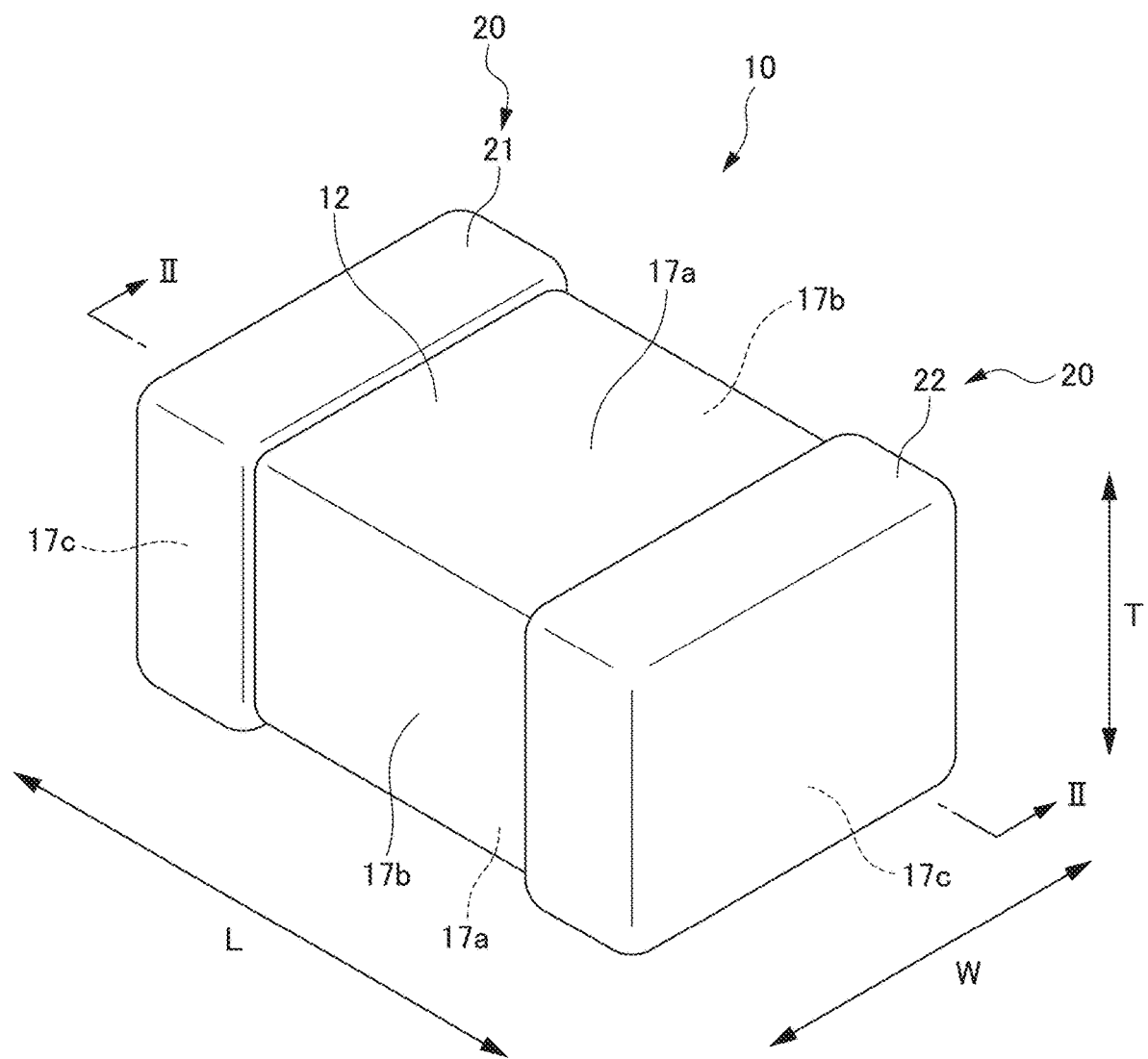
FIG. 1 is a schematic perspective view of a multilayer ceramic capacitor according to a preferred embodiment of the present invention.
Figure 2:
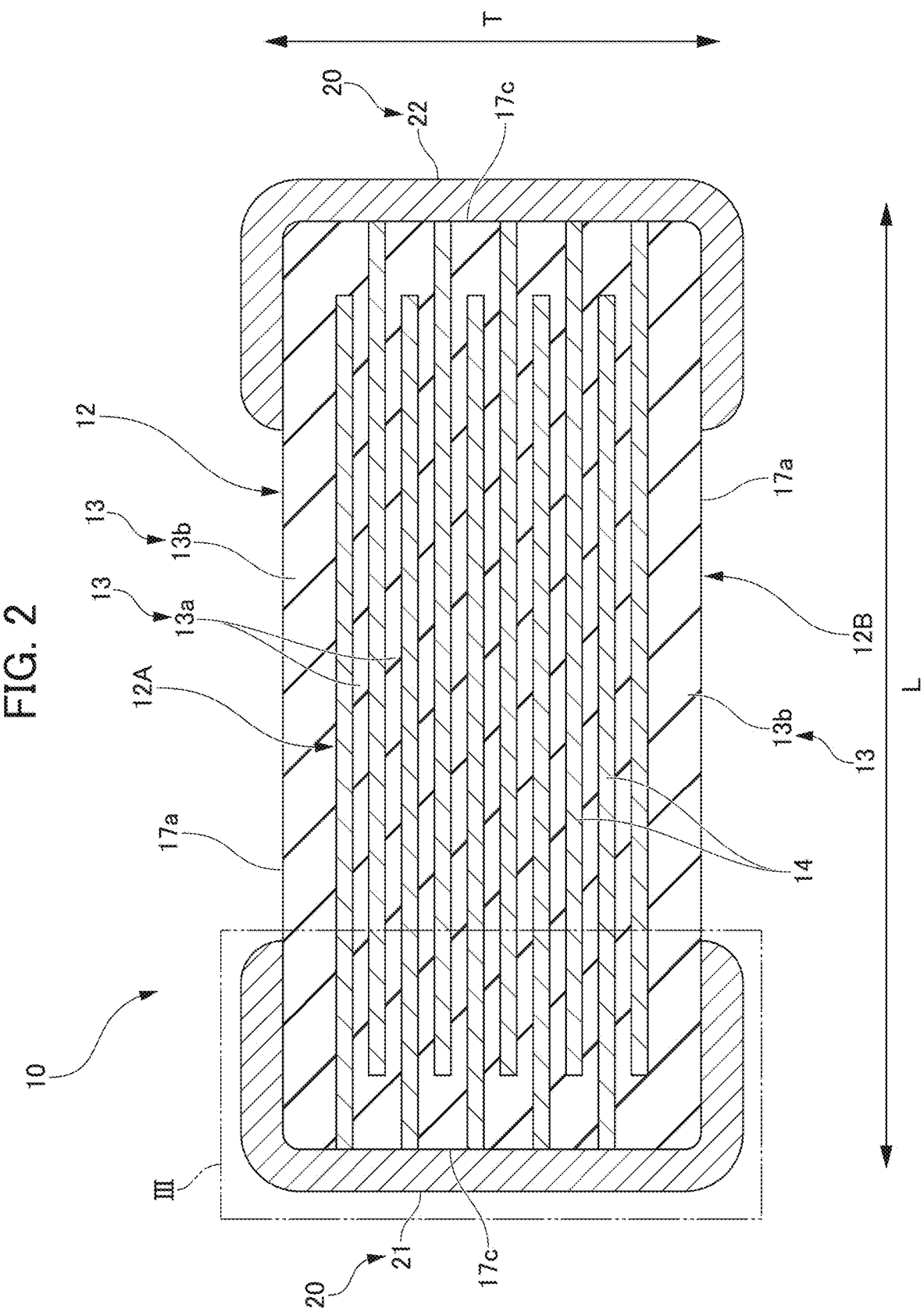
FIG. 2 is a cross-sectional view taken along the line II-II of FIG. 1.

FIG. 1 is a schematic perspective view of a multilayer ceramic capacitor 10 according to a preferred embodiment of the present invention. FIG. 2 is a cross-sectional view taken along the line II-II shown in FIG. 1.

As shown in FIG. 1, the multilayer ceramic capacitor 10 of the present preferred embodiment has a rectangular or substantially rectangular parallelepiped shape. The multilayer ceramic capacitor 10 includes a multilayer body 12 and a pair of external electrodes 20 provided on the multilayer body 12 and spaced apart from each other.

In FIG. 1, the arrow T indicates a thickness direction of the multilayer ceramic capacitor 10, the multilayer body 12, and the external electrode 20. In FIGS. 1 and 2, the arrow L indicates a length direction orthogonal or substantially orthogonal to the thickness direction T of the multilayer ceramic capacitor 10, the multilayer body 12, and the external electrode 20. In FIG. 1, the arrow W indicates a width direction orthogonal or substantially orthogonal to the thickness direction T and the length direction L of the multilayer ceramic capacitor 10, the multilayer body 12, and the external electrode 20. The cross-sectional view shown in FIG. 2 shows a cross section LT, which is a cross section taken along the length direction L and the thickness direction T at the center portion in the width direction W.

As shown in FIG. 1, the multilayer body 12 includes a pair of main surfaces 17a opposed to each other in the thickness direction T, a pair of lateral surfaces 17b opposed to each other in the width direction W, and a pair of end surfaces 17c opposed to each other in the length direction L.

Examples of the dimensions of the multilayer ceramic capacitor 10 include, but are not limited to, for example, dimensions in which the length direction L is about 0.2 mm or more and about 1.2 mm or less, the width direction W is about 0.1 mm or more and about 0.7 mm or less, and the thickness direction T is about 0.1 mm or more and about 0.7 mm or less.

The pair of external electrodes 20 include a first external electrode 21 provided at one end in the length direction L of the multilayer body 12 and a second external electrode 22 provided at the other end in the length direction L of the multilayer body 12. Each of the first external electrode 21 and the second external electrode 22 covers the end surface 17c of the multilayer body 12. Hereinafter, when the first external electrode 21 and the second external electrode 22 having the same or substantially the same configuration are described without being distinguished from each other, both of them may be simply referred to as an external electrode 20.

As shown in FIG. 2, the multilayer body 12 includes a plurality of dielectric ceramic layers 13 and a plurality of internal electrode layers 14 alternately laminated along the thickness direction T. The thickness direction T refers to the stacking direction of the plurality of dielectric ceramic layers 13 and the plurality of internal electrode layers 14. Furthermore, the multilayer body 12 includes an inner layer portion 12A in which a plurality of internal electrode layers 14 are opposed to each other with the dielectric ceramic layer 13 interposed therebetween, and a pair of outer layer portions 12B that sandwich the inner layer portion 12A in the thickness direction T and include only the dielectric ceramic layer 13. The dielectric ceramic layer 13 includes a first dielectric ceramic layer 13a of the inner layer portion 12A and a second dielectric ceramic layer 13b of the outer layer portion 12B. The thickness of the dielectric ceramic layer 13b of the outer layer portion 12B is larger than the thickness of the dielectric ceramic layer 13a of the inner layer portion 12A sandwiched between the internal electrode layers 14.

The dielectric ceramic layer 13 is formed by firing, for example, a ceramic material including barium titanate as a main component. The internal electrode layer 14 is formed of, for example, a metal material such as Ni, Cu, Ag, Pd, Ag—Pd alloy, or Au, or another conductive material.

As shown in FIG. 2, one of a pair of internal electrode layers 14 adjacent to each other across the first dielectric ceramic layer 13a along the thickness direction T is electrically connected to the first external electrode 21, and the other is electrically connected to the second external electrode 22. Thus, a plurality of capacitor elements are electrically connected in parallel between the first external electrode 21 and the second external electrode 22.

The thickness of the internal electrode layer 14 is preferably, for example, about 0.3 µm or more and about 0.4 µm or less. By setting the thickness of the internal electrode layer 14 to about 0.3 µm or more, defects such as electrode disconnection are reduced or prevented. Furthermore, by making the thickness of the internal electrode layer 14 about 0.4 µm or less, it is possible to reduce or prevent a decrease in the proportion occupied by the dielectric layer in the capacitor and a decrease in capacitance due to the decrease.

The thickness of the first dielectric ceramic layer 13a of the inner layer portion 12A sandwiched between the pair of internal electrode layers 14 is preferably, for example, about 0.10 µm or more and about 1.00 µm or less. By setting the thickness of the first dielectric ceramic layer 13a to about 0.10 µm or more, it is possible to prevent deterioration of the insulation characteristics, and thus to improve reliability. On the other hand, when the thickness of the first dielectric ceramic layer 13a is about 1.00 µm or less, it is possible to promote a reduction in thickness and improve the capacitance. The number of the first dielectric ceramic layers 13a is preferably, for example, 100 or more and 900 or less.

In the multilayer ceramic capacitor 10, for example, the multilayer body 12 is formed by laminating materials to be the dielectric ceramic layer 13 and the internal electrode layer 14, and each material to be the multilayer body 12 is fired. Then, the external electrodes 20 are formed at both ends in the length direction L of the multilayer body 12, such that the multilayer ceramic capacitor 10 is manufactured.

Figure 3:
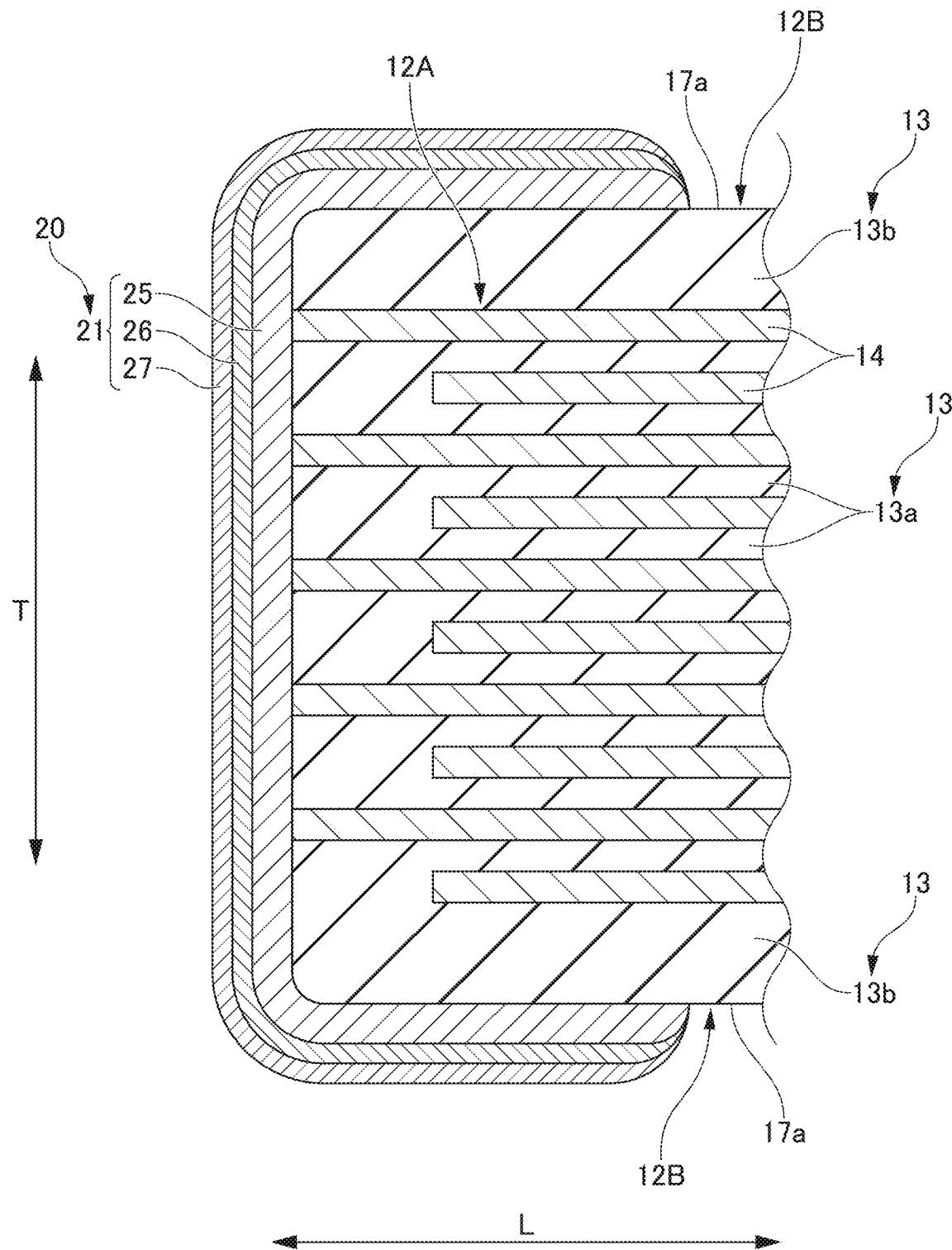
FIG. 3 is an enlarged view of a portion III in FIG. 2.

FIG. 3 shows details of the external electrode 20. FIG. 3 is an enlarged view of a portion indicated by III in FIG. 2, and shows the first external electrode 21, but the second external electrode 22 has the same or a similar configuration.

As shown in FIG. 3, the external electrode 20 of the present preferred embodiment includes a base layer 25 which is a sintered metal layer, a first plated layer 26 on the base layer 25, and a second plated layer 27 on the first plated layer 26. That is, the external electrode 20 is a laminated film having electric conductivity in which a multilayer plated layer including the first plated layer 26 and the second plated layer 27 is provided on the base layer 25. The external electrode 20 is not limited to this configuration and, for example, the plated layer may be a single layer.

The base layer 25 is, for example, a sintered metal layer including glass in Cu. The glass is, for example, a glass component including oxides such as silicic acid ($SiO_2$), alumina ($Al_2O_3$), titanium oxide ($TiO_2$), barium oxide ($BaO_2$), and zirconia ($ZrO_2$). The base layer 25 can be formed by firing on both ends in the length direction L of the multilayer body 12. The base layer 25 may be co-fired, which is performed at the same time in the step of firing the multilayer body 12, or may be post-fired, which is performed alone after firing the multilayer body 12. The metal component of the base layer 25 may be, for example, Ni, Ag, Pd, Ag—Pd alloy, Au, or the like, in addition to Cu. The base layer 25 is in direct contact with and electrically connected to the end surfaces of the plurality of internal electrode layers 14 exposed at the end surfaces 17c on both sides of the multilayer body 12.

The first plated layer 26 is, for example, a Ni plated layer. The first plated layer 26 is provided on the base layer 25 to cover the base layer 25. The second plated layer 27 is a layer of the surface layer of the external electrode 20, and is, for example, a Sn plated layer. The second plated layer 27 is provided on the first plated layer 26 and covers the first plated layer 26. The second plated layer 27 is preferably a metal that melts at a reflow temperature during reflow mounting described later, and preferably includes Sn, for example. In a case where the second plated layer 27 is a Sn plated layer, the second plated layer 27 preferably includes, for example, about 99 wt % or more of Sn.

The external electrode 20 covers the entire or substantially the entire surface of the end surface 17c of the multilayer body 12, and further extends over four surfaces of a pair of main surfaces 17a opposed to each other and a pair of lateral surfaces 17b opposed to each other.

Figure 4:
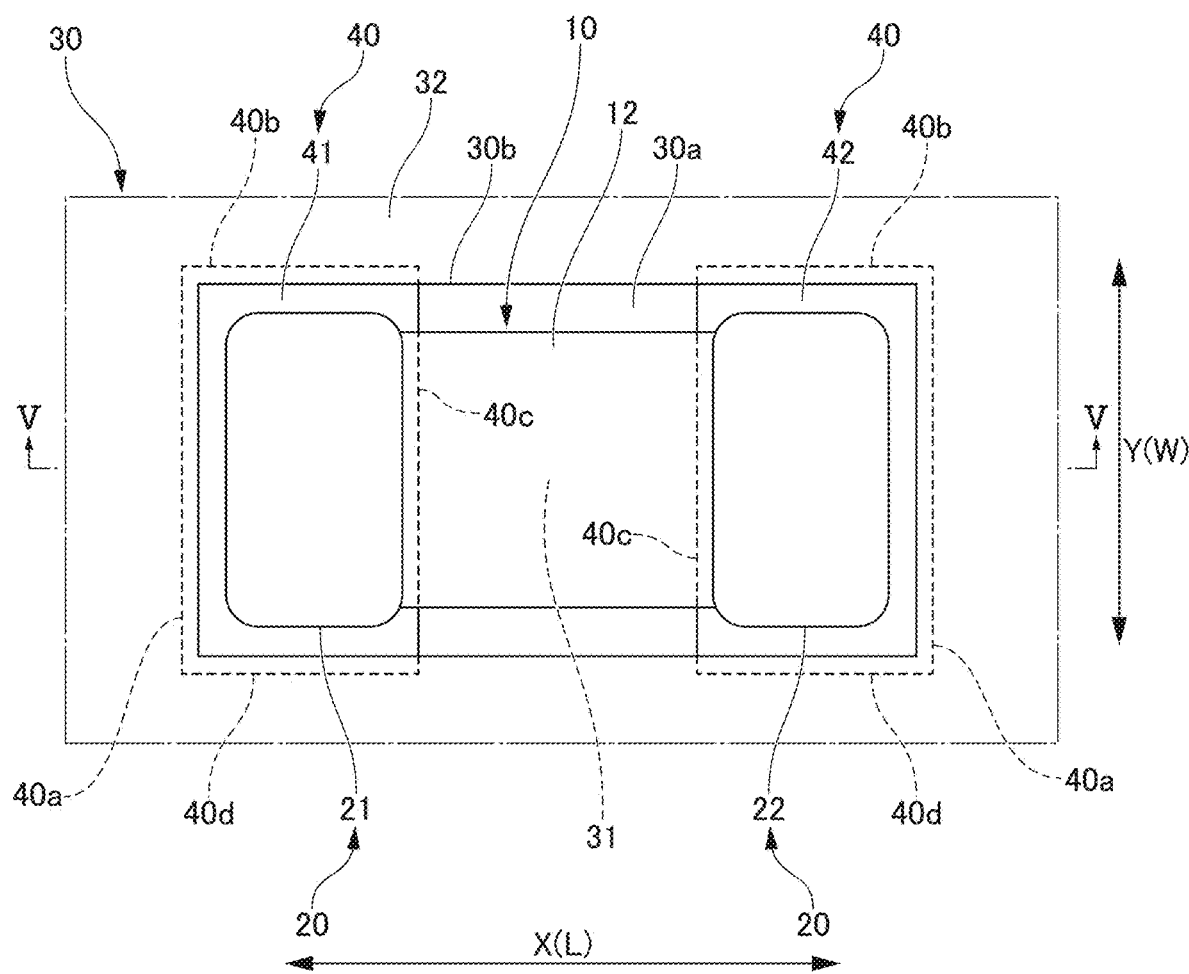
FIG. 4 is a plan view of a mounting structure of a multilayer ceramic capacitor according to a preferred embodiment of the present invention.
Figure 5:
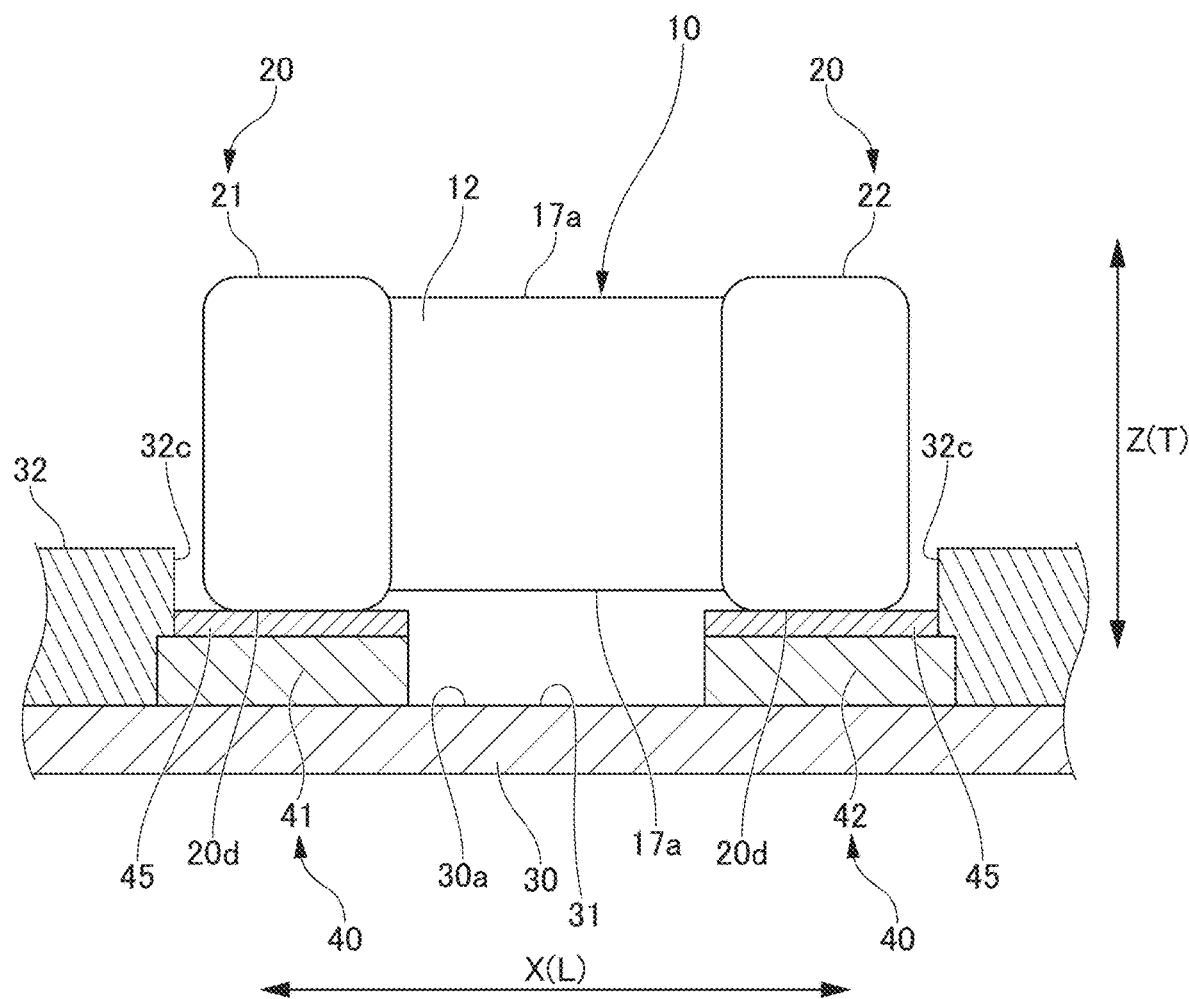
FIG. 5 is a cross-sectional view taken along the line V-V of FIG. 4.

Next, a mounting structure of the multilayer ceramic capacitor 10 according to the present preferred embodiment will be described. FIG. 4 is a plan view of a mounting structure according to the present preferred embodiment. FIG. 5 is a cross-sectional view taken along the line V-V of FIG. 4. In the mounting structure according to the present preferred embodiment, the multilayer ceramic capacitor 10 is mounted on a board 30.

As shown in FIGS. 4 and 5, the mounting structure according to the present preferred embodiment includes the board 30, a pair of electrode pads 40 provided on the board 30 and spaced apart from each other, a bonding metal 45 provided on each of the electrode pads 40, and the multilayer ceramic capacitor 10. The multilayer ceramic capacitor 10 is mounted on the board 30 with the bonding metal 45 formed by reflow mounting.

The board 30 has a sheet shape and includes a material made of, for example, an insulating material such as resin, glass, glass epoxy, paper phenol, or ceramics. A surface 30a of the board 30 is covered with a resist film 32 made of, for example, solder resist while leaving a mounting region 30b. The inside of the rectangle indicated by the solid line 30b in FIG. 4 is the mounting region 30b. The surface of the mounting region 30b is a portion of the surface 30a of the board 30. The multilayer ceramic capacitor 10 is mounted in the mounting region 30b such that the length direction L is parallel or substantially parallel to the X direction shown in FIGS. 4 and 5, and the width direction W is parallel or substantially parallel to the Y direction orthogonal or substantially orthogonal to the X direction. The mounting region 30b has a rectangular or substantially rectangular shape elongated in the X direction.

Both the X direction and the Y direction are plane directions along the surface 30a of the board 30. FIG. 4 also shows the length direction L and the thickness direction T of the multilayer ceramic capacitor 10 shown in FIG. 1. FIG. 5 also shows the length direction L and the width direction W of the multilayer ceramic capacitor 10 shown in FIG. 1. In FIG. 5, Z denotes a vertical or up-down direction orthogonal or substantially orthogonal to the X direction and the Y direction.

The electrode pad 40 includes a first electrode pad 41 provided at one end portion in the length direction of the mounting region 30b and a second electrode pad 42 provided at the other end portion in the length direction. The first electrode pad 41 and the second electrode pad 42 are both rectangular or substantially rectangular in a plan view and have the same or substantially the same dimension. A separation portion 31 is provided between the first electrode pad 41 and the second electrode pad 42. The separation portion 31 is a portion of the surface of the mounting region 30b. The first electrode pad 41 and the second electrode pad 42 are spaced apart from each other in the X direction with the separation portion 31 interposed therebetween so that the positions in the Y direction orthogonal or substantially orthogonal to the X direction are the same or substantially the same. Hereinafter, when the first electrode pad 41 and the second electrode pad 42 having the same or substantially the same configuration are described without being distinguished from each other, both of them may be simply referred to as an electrode pad 40.

As shown in FIG. 4, the electrode pads 40 each include two sides along the Y direction and two sides along the X direction. The two sides along the Y direction are a third side 40c provided inside which is adjacent to the separation portion 31 and a first side 40a provided outside which is spaced away from the separation portion 31. The third side 40c and the first side 40a are opposed to each other. The two sides along the X direction are a second side 40b and a fourth side 40d which are spaced apart from each other in the Y direction and are opposed to each other.

In the present preferred embodiment, as shown in FIG. 4, the resist film 32 covers the first side 40a, the second side 40b, and the fourth side 40d of the electrode pad 40. That is, both end portions of the electrode pad 40 in the Y direction and an end portion provided outside (spaced away from the separation portion 31) in the X direction are covered with the resist film 32, and thus are not exposed. The third side 40c of the electrode pad 40 is exposed or substantially exposed except for both ends in the Y direction covered with the resist film 32, and is not covered with the resist film 32. Therefore, the resist film 32 is provided around three sides of the electrode pad 40 corresponding to the first side 40a, the second side 40b, and the fourth side 40d.

Wires (not shown) provided on the surface 30a of the board 30 are connected to the first electrode pad 41 and the second electrode pad 42, respectively. Each of the first electrode pad 41 and the second electrode pad 42 is provided at an end portion of the wiring. That is, the wiring is in a discontinuous state with the separation portion 31 interposed therebetween, and is electrically conductive when the multilayer ceramic capacitor 10 is connected to each of the first electrode pad 41 and the second electrode pad 42.

The first electrode pad 41, the second electrode pad 42, and the wiring are preferably made of a highly electrically conductive metal, for example, and formed by depositing Cu on the surface 30a of the board 30. The highly electrically conductive metal may be, for example, Ag, Au, or the like.

In the multilayer ceramic capacitor 10, the first external electrode 21 is connected to the first electrode pad 41 via the bonding metal 45, and the second external electrode 22 is connected to the second electrode pad 42 via the bonding metal 45. In each of the first external electrode 21 and the second external electrode 22, a rectangular or substantially rectangular connection surface 20d facing the surface 30a of the board 30 is connected to the bonding metal 45. The connection surface 20d is a surface parallel or substantially parallel to the main surface 17a of the multilayer body 12. The multilayer ceramic capacitor 10 is provided such that the center thereof in the width direction W coincides or substantially coincides with the center in the Y direction of the first electrode pad and the second electrode pad.

In the multilayer ceramic capacitor 10 mounted on the board 30 in this manner, the length direction L follows or substantially follows the X direction, the width direction W follows or substantially follows the Y direction, and the thickness direction T follows or substantially follows the vertical direction Z orthogonal or substantially orthogonal to the surface 30a of the board 30. With such a configuration, one of the pair of main surfaces 17a of the multilayer body 12 faces the surface 30a of the board 30 in parallel or substantially in parallel.

The multilayer ceramic capacitor 10 can be mounted on the board 30 by, for example, reflow. In the present preferred embodiment, the multilayer ceramic capacitor 10 is reflow-mounted on the board 30 using flux. The flux is generally used as a soldering promoter which imparts fluidity to a metal used for soldering.

Figure 6:
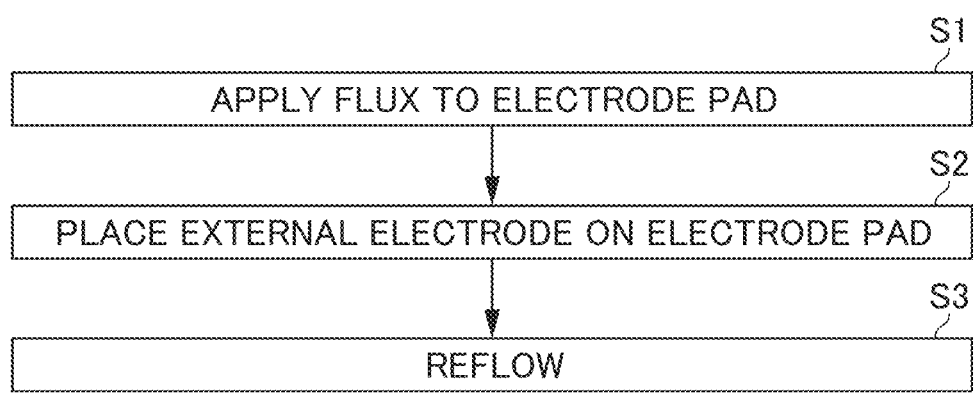
FIG. 6 is a flowchart showing an example of a method of mounting a multilayer ceramic capacitor according to a preferred embodiment of the present invention.

FIG. 6 is a flowchart showing a non-limiting example of a method of mounting the multilayer ceramic capacitor 10 by reflow mounting. As shown in FIG. 6, in this mounting method, first, the flux is applied to the surface of the electrode pad 40 (Step S1). In this case, the flux includes only a liquid including no metal component. Next, the external electrode 20 is disposed on the surface of the electrode pad 40 coated with the flux (Step S2). Next, the board is heated to a predetermined reflow temperature and reflowed (Step S3). By reflowing, the metal of the second plated layer 27 defining and functioning as the outermost surface of the external electrode 20 is melted, and the molten metal is mixed into the flux and flows between the connection surface 20d of the external electrode 20 and the surface of the electrode pad 40, such that the molten metal spreads. After cooling, the bonding metal 45 formed by curing the metal mixed in the flux retains the state of adhering to the external electrode 20 and the electrode pad 40, and thus the connection state is established. When the second plated layer 27 is, for example, an Sn plated layer and includes about 99 wt % or more of Sn, the metal defining and functioning as the bonding metal 45 by the reflow is Sn, but the metal includes Cu deposited slightly from the electrode pad 40. Therefore, the bonding metal 45 includes Sn and Cu, and hardly includes metals other than Sn and Cu. The content of metals other than Sn and Cu contained in the bonding metal 45 is, for example, less than about 1 wt %.

Figure 7:
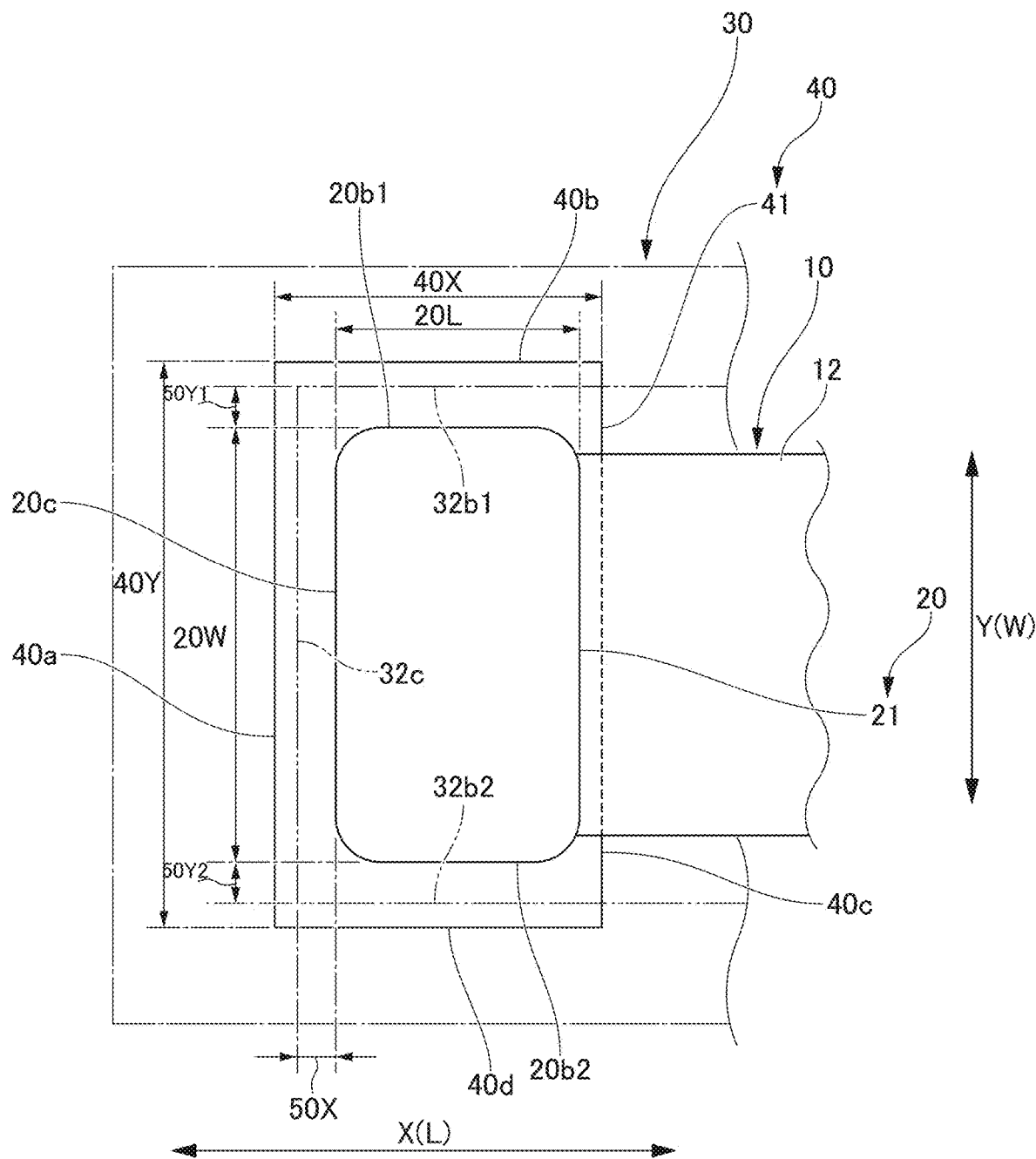
FIG. 7 is a plan view illustrating a relationship between dimensions and the arrangement of external electrodes of a multilayer ceramic capacitor and electrode pads according to a preferred embodiment of the present invention.

FIG. 7 is a plan view illustrating the relationship between the dimensions and the arrangement of the external electrode 20 and the electrode pad 40. Although the external electrode 20 and the electrode pad 40 in FIG. 7 show the first external electrode 21 and the first electrode pad 41, respectively, the same applies to the second external electrode 22 and the second electrode pad 42.

As shown in FIG. 7, the lengths of the first side 40a and the third side 40c of the electrode pad 40, that is, the length 40Y of the electrode pad 40 in the Y direction is longer than the length 20W of the external electrode 20 along the width direction W. The length 40Y of the electrode pad 40 in the Y direction is preferably, for example, about 110% or more and about 115% or less of the length 20W of the external electrode 20 in the width direction W.

The lengths of the second side 40b and the fourth side 40d of the electrode pad 40, that is, the length 40X of the electrode pad 40 in the X direction, is longer than the length 20L of the external electrode 20 along the length direction L. The length 40X of the electrode pad 40 in the X direction is preferably, for example, about 110% or more and about 115% or less of the length 20L in the length direction L of the external electrode 20.

By setting the dimension ratio of the electrode pad 40 with respect to the external electrode 20 as described above, the connection surface 20d of the external electrode has an area which fits within the region of the electrode pad 40. This makes it difficult for the external electrode 20 to interfere with the resist film 32 around the electrode pad 40, and the entire or substantially the entire surface of the connection surface 20d of the external electrode 20 is securely mounted on the surface of the electrode pad 40. As a result, it is possible to perform mounting reliably using flux. For example, when the external electrode 20 is automatically mounted by a mounter, the external electrode 20 may be placed on the resist film 32 depending on the mounting accuracy of the mounter, resulting in poor bonding. However, such a disadvantage is less likely to occur in the preferred embodiment.

Furthermore, it is preferable that a predetermined separation distance is set between the resist film 32 and the external electrode 20 provided on the electrode pad 40 such that they are spaced apart from each other in the direction of the surface 30a of the board 30.

As shown in FIG. 7, the separation distance in the present preferred embodiment includes an X-direction separation distance 50X between the end surface 20c of the external electrode 20 and the inner wall surface 32c of the resist film 32 opposed to the end surface 20c. Furthermore, the separation distance includes a Y-direction separation distance 50Y1 between one lateral surface 20b1 of the external electrode 20 and the inner wall surface 32b1 of the resist film 32 opposed to the lateral surface 20b1, and a Y-direction separation distance 50Y2 between the other lateral surface 20b2 of the external electrode 20 and the inner wall surface 32b2 of the resist film 32 opposed to the lateral surface 20b2.

The X-direction separation distance 50X, the Y-direction separation distance 50Y1, and the Y-direction separation distance 50Y2 are preferably, for example, about 30.8% or more of the multilayer ceramic capacitor 10. Furthermore, the X-direction separation distance 50X, the Y-direction separation distance 50Y1, and the Y-direction separation distance 50Y2 are preferably, for example, about 0.004 mm or more. These separation distances may be set according to the size of the multilayer ceramic capacitor 10. However, such separation distances are preferably applied to multilayer ceramic capacitors of "0201" size each having the length direction L, the width direction W, and the thickness direction T being about 0.25 mm×about 0.125 mm×about 0.125 mm, for example.

Even when the X-direction separation distance 50X, the Y-direction separation distance 50Y1, and the Y-direction separation distance 50Y2 are set between the external electrode 20 and the resist film 32, the entire or substantially the entire surface of the connection surface 20d of the external electrode 20 is reliably disposed on the surface of the electrode pad 40 without interfering with the resist film 32 around the electrode pad 40. As a result, it is possible to perform mounting reliably using flux. Furthermore, flux is blocked by the inner wall surface 32c, the inner wall surface 32b1, and the inner wall surface 32b2 of the resist film 32, and wasteful outflow is reduced or prevented, such that the metal defining and functioning as the bonding metal 45 is efficiently supplied to the electrode pad 40. Therefore, it is possible to perform good mounting with a minimum necessary flux amount.

The mounting structure of the electronic component according to the present preferred embodiment includes at least two electrode pads 40 spaced apart from each other on the board 30, at least two external electrodes 20 of the multilayer ceramic capacitor 10, which is an electronic component, the at least two external electrodes 20 being respectively connected to the at least two electrode pads 40, and the resist film 32 provided around each of the at least two electrode pads 40 on the surface 30a of the board 30, in which a predetermined separation distance in a surface direction of the board 30 is set, as the X-direction separation distance 50X, the Y-direction separation distance 50Y1, and the Y-direction separation distance 50Y2, between the resist film 32 and each of the at least two external electrodes 20 provided respectively on the at least two electrode pads 40, and in which the second plated layer 27, which is at least a surface layer of each of the at least two external electrodes 20, includes, for example, about 99 wt % or more of Sn.

With such a configuration, when the multilayer ceramic capacitor 10 is mounted on the board 30, the external electrode 20 is less likely to interfere with the resist film 32, and the external electrode 20 is reliably brought into contact with the electrode pad 40, such that it is possible to obtain a good bonding state. Since the second plated layer 27, which is the surface layer of the external electrode 20, includes, for example, about 99 wt % or more of Sn, the second plated layer 27 is likely to melt during reflow mounting using flux, and thus it is possible to perform good mounting.

In the mounting structure according to the present preferred embodiment, the X-direction separation distance 50X, the Y-direction separation distance 50Y1, and the Y-direction separation distance 50Y2 are each, for example, about 30.8% or more of a dimensional tolerance of the multilayer ceramic capacitor 10.

With such a configuration, the above-described X-direction separation distance 50X, Y-direction separation distance 50Y1, and Y-direction separation distance 50Y2 can be sufficiently secured, and thus, it is possible to provide the external electrode 20 on the electrode pad 40 more reliably.

In the mounting structure according to the present preferred embodiment, the X-direction separation distance 50X, the Y-direction separation distance 50Y1, and the Y-direction separation distance 50Y2 are each, for example, about 0.004 mm or more.

With such a configuration, the above-described X-direction separation distance 50X, Y-direction separation distance 50Y1, and Y-direction separation distance 50Y2 can be sufficiently secured, and thus it is possible to provide the external electrode 20 on the electrode pad 40 more reliably.

In the mounting structure according to the present preferred embodiment, the multilayer ceramic capacitor 10 includes, as the at least two external electrodes 20, the first external electrode 21 and the second external electrode 22 that are spaced apart from each other, in which the first external electrode 21 and the second external electrode 22 each include the length direction L along the direction of being spaced apart from each other and the width direction W orthogonal or substantially orthogonal to the length direction L, the at least two electrode pads 40 include the first electrode pad 41 connected to the first external electrode 21 and the second electrode pad 42 connected to the second external electrode 22, the first electrode pad 41 and the second electrode pad 42 each have a rectangular or substantially rectangular shape, and are spaced apart from each other in the length direction L with the separation portion 31 interposed therebetween and arranged in parallel or substantially in parallel to each other, the first electrode pad 41 and the second electrode pad 42 each include the third side 40c that extends along the width direction W of the external electrode 20 and is provided inside which is adjacent to the separation portion 31 and the first side 40a that extends along the width direction W and is provided outside which is spaced away from the separation portion 31, where the third side and the first side are opposed to each other, and the second side 40b and the fourth side 40d that each extends along the length direction L of the first and second external electrodes 20 and are opposed to each other, the length of the first side 40a and the length of the third side 40c are each, for example, about 110% or more and about 115% or less of the length of the first or second external electrode 20 along the width direction W, and the length of the second side 40b and the length of the fourth side 40d are each, for example, about 110% or more and about 115% or less of the length of the first or second external electrode 20 along the length direction L.

With such a configuration, since the entire or substantially the entire surface of the connection surface 20d of the external electrode 20 can be reliably mounted on the surface of the electrode pad 40 without interfering with the resist film 32 around the electrode pad 40, it is possible to perform mounting reliably. Furthermore, since the flux is blocked by the resist film 32 and wasteful outflow is reduced or prevented, it is possible to perform good mounting with a minimum amount of flux.

In the mounting structure according to the present preferred embodiment, the resist film 32 is not provided at the separation portion 31 between the electrode pads 40, and a surface of the board 30 is exposed.

With such a configuration, the external electrode 20 is separated from the electrode pad 40 by placing the multilayer body 12 of the multilayer ceramic capacitor 10 on the resist film, and inducing contact failure is prevented such that it is possible to obtain a good bonded state.

The mounting method according to the present preferred embodiment is directed to the mounting method of providing the external electrodes 20 of the multilayer ceramic capacitor 10 on the electrode pads 40 of the board 30, the mounting method including applying flux on the electrode pads 40, placing the external electrodes 20 on the electrode pads 40 to which the flux is applied, and performing reflow.

With such a configuration, by the reflow mounting, it is possible to perform accurately mounting of the external electrode 20 of the multilayer ceramic capacitor 10 on the electrode pad 40 of the board 30.

It should be noted that the present invention is not limited to the above-described preferred embodiments, and that modifications, improvements, and the like are included in the present invention as long as the object of the present invention can be achieved.

For example, the multilayer ceramic capacitor 10 in the above-described preferred embodiment is an example of an electronic component, and such an electronic component is not limited thereto, and other two-terminal electronic components such as, for example, thermistors and inductors can be applied. Furthermore, the electronic component is not limited to a two-terminal electronic component, and may be a three-terminal electronic component or the like.

The shape of the electrode pad 40 is not limited to a rectangular or substantially rectangular shape, and may be, for example, a shape corresponding to the shape of the external electrode of the electronic component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mounting structure of an electronic component comprising:
   at least two electrode pads spaced apart from each other on a board;
   at least two external electrodes of the electronic component respectively connected to the at least two electrode pads; and
   a resist film provided around each of the at least two electrode pads on a surface of the board; wherein
   a predetermined separation distance in a surface direction of the board is set between the resist film and each of the at least two external electrodes provided respectively on the at least two electrode pads;
   the separation distance is about 30.8% or more of a dimensional tolerance of the electronic component;
   at least a surface layer of each of the at least two external electrodes includes about 99 wt % or more of Sn; and
   the at least two external electrodes are respectively connected to the at least two electrode pads by a bonding material, and a largest portion of the bonding material is provided at a mounting surface of the at least two external electrodes that faces the at least two electrode pads.

2. The mounting structure of an electronic component according to claim 1, wherein the separation distance is about 0.004 mm or more.

3. The mounting structure of an electronic component according to claim 1, wherein
   the at least two external electrodes include a first external electrode and a second external electrode spaced apart from each other;

the first external electrode and the second external electrode each include a length direction along a direction of being spaced apart from each other and a width direction orthogonal or substantially orthogonal to the length direction;

the at least two electrode pads include a first electrode pad connected to the first external electrode and a second electrode pad connected to the second external electrode;

the first electrode pad and the second electrode pad each have a rectangular or substantially rectangular shape, and are spaced apart from each other in the length direction with a separation portion interposed therebetween and positioned in parallel or in substantially parallel to each other;

the first electrode pad and the second electrode pad each include:

a third side extending along the width direction and on an inside which is adjacent to the separation portion, a first side extending along the width direction and on an outside which is spaced away from the separation portion, and the third side and the first side are opposed to each other; and a second side and a fourth side each extending along the length direction of the first and second external electrodes and being opposed to each other;

a length of the first side and a length of the third side are each about 110% or more and about 115% or less of a length of the first or second external electrode along the width direction; and a length of the second side and a length of the fourth side are each about 110% or more and about 115% or less of a length of the first or second external electrode along the length direction.

4. The mounting structure of an electronic component according to claim 3, wherein the resist film is not located at the separation portion, and a surface of the board is exposed.

5. The mounting structure of an electronic component according to claim 1, wherein the electronic component is a multilayer ceramic capacitor including a multilayer body and the two external electrodes on the multilayer body.

6. The mounting structure of an electronic component according to claim 5, wherein the multilayer body has a dimension a length direction of about 0.2 mm or more and about 1.2 mm or less, a dimension in a width direction of about 0.1 mm or more and about 0.7 mm or less, and a dimension in a thickness direction of about 0.1 mm or more and about 0.7 mm or less.

7. The mounting structure of an electronic component according to claim 5, wherein the multilayer body includes a plurality of dielectric ceramic layers and a plurality of internal electrode layers alternately laminated in a thickness direction.

8. The mounting structure of an electronic component according to claim 7, wherein each of the plurality of dielectric ceramic layers includes barium titanate as a main component.

9. The mounting structure of an electronic component according to claim 7, wherein each of the plurality of internal electrode layers includes Ni, Cu, Ag, Pd, Ag—Pd alloy, or Au.

10. A mounting method of providing the at least two external electrodes on the at least two electrode pads in the mounting structure of the electric component according to claim 1, the mounting method comprising the steps of:

applying flux on the at least two electrode pads;

placing the at least two external electrodes on the at least two electrode pads to which the flux is applied; and performing reflow.

11. The mounting method according to claim 10, wherein the separation distance is about 0.004 mm or more.

12. The mounting method according to claim 10, wherein the at least two external electrodes include a first external electrode and a second external electrode spaced apart from each other;

the first external electrode and the second external electrode each include a length direction along a direction of being spaced apart from each other and a width direction orthogonal or substantially orthogonal to the length direction;

the at least two electrode pads include a first electrode pad connected to the first external electrode and a second electrode pad connected to the second external electrode;

the first electrode pad and the second electrode pad each have a rectangular or substantially rectangular shape, and are spaced apart from each other in the length direction with a separation portion interposed therebetween and arranged in parallel or in substantially parallel to each other;

the first electrode pad and the second electrode pad each include:

a third side extending along the width direction and on an inside which is adjacent to the separation portion, a first side extending along the width direction and on an outside which is spaced away from the separation portion, and the third side and the first side are opposed to each other; and a second side and a fourth side each extending along the length direction of the first and second external electrodes and being opposed to each other;

a length of the first side and a length of the third side are each about 110% or more and about 115% or less of a length of the first or second external electrode along the width direction; and a length of the second side and a length of the fourth side are each about 110% or more and about 115% or less of a length of the first or second external electrode along the length direction.

13. The mounting method according to claim 12, wherein the resist film is not located at the separation portion, and a surface of the board is exposed.

14. The mounting method according to claim 10, wherein the electronic component is a multilayer ceramic capacitor including a multilayer body and the two external electrodes on the multilayer body.

15. The mounting method according to claim 14, wherein the multilayer body has a dimension a length direction of about 0.2 mm or more and about 1.2 mm or less, a dimension in a width direction of about 0.1 mm or more and about 0.7 mm or less, and a dimension in a thickness direction of about 0.1 mm or more and about 0.7 mm or less.

16. The mounting method according to claim 14, wherein the multilayer body includes a plurality of dielectric ceramic layers and a plurality of internal electrode layers alternately laminated in a thickness direction.

17. The mounting method according to claim 16, wherein each of the plurality of dielectric ceramic layers includes barium titanate as a main component.

18. The mounting method according to claim 16, wherein each of the plurality of internal electrode layers includes Ni, Cu, Ag, Pd, Ag—Pd alloy, or Au.

* * * * *